United States Patent [19]

Mahan

[11] Patent Number: 4,940,898
[45] Date of Patent: * Jul. 10, 1990

[54] SEMICONDUCTING METAL SILICIDE RADIATION DETECTORS

[75] Inventor: John E. Mahan, Fort Collins, Colo.

[73] Assignee: Colorado State University Research Foundation, Fort Collins, Colo.

[*] Notice: The portion of the term of this patent subsequent to Nov. 1, 2005 has been disclaimed.

[21] Appl. No.: 189,310

[22] Filed: May 2, 1988

Related U.S. Application Data

[63] Continuation-in-part of Ser. No. 913,354, Sep. 30, 1986, Pat. No. 4,782,377.

[51] Int. Cl.$^5$ .............................................. H01L 31/02
[52] U.S. Cl. .............................. 250/338.4; 250/370.12
[58] Field of Search ........... 250/338.4, 370.13, 370.12, 250/370.04

[56] References Cited

U.S. PATENT DOCUMENTS 4,782,377  11/1988  Mahan ............................... 357/30 C

OTHER PUBLICATIONS

T. Siegrist, F. Hulliger and G. Travaglini; The Crystal Structure and Some Properties of ReSi$_2$; Journal of the Less-Common Metals, 92, 1983. pp. 119-129.

Bijan K. Bhattacharyya, D. M. Bylander, and Leonard Kleinman; Fully Relativistic Energy Bands and Cohesive Energy of ReSi$_2$; Phys. Rev., 33(6), 03/15/86; pp. 3947-3951.

V. S. Neshpor and G. V. Samsonov; Electron Structure, Chemical Bonding and Physical Properties of Rhenium Disilicide and Some of its Alloys; Jan. 25, 1965; pp. 599-605, Inorganic Materials, 1.

I. M. Chapnik; Atomic-Volume Deviations in Transition Metal Silicides and the Electrical Properties of Rhenium Disilicide; pp. K193-K198, phys. stat. sol. (a), 58, 1980.

Primary Examiner—Carolyn E. Fields
Attorney, Agent, or Firm—Dorr, Carson, Sloan & Peterson

[57] ABSTRACT

Semiconducting metal silicide electromagnetic radiation detectors have a thin film of semiconducting metal silicide, such as rhenium disilicide, grown or deposited on a silicon wafer. The detectors are intrinsic semiconductor detectors and can be formed either as discrete devices, or monolithically on a silicon chip to provide an integrated detector or detector array. The semiconducting rhenium disilicide detectors are efficient at wavelengths which mate with the transmission capabilities of certain optical fibers, thereby enhancing the combination of infrared detectors and optical fiber transmission previously known. The range of electromagnetic radiation sensed by these rhenium disilicide detectors include the infrared range of wavelengths up to 14 microns.

30 Claims, 6 Drawing Sheets

INFRARED DETECTORS

SEMICONDUCTING METAL SILICIDE RADIATION DETECTORS

CROSS REFERENCE TO RELATED APPLICATIONS

This application is a continuation in part of application serial number 913,354 filed on Sept. 30, 1986, now U.S. Pat. No. 4,782,377.

FIELD OF THE INVENTION

The present invention relates to an electromagnetic radiation detector made from rhenium disilicide grown or deposited on a silicon wafer or other suitable substrate. Rhenium disilicide ($ReSi_2$), is an effective intrinsic electromagnetic radiation detector. A combination of electromagnetic radiation detector and source with electronics can be fabricated on a single chip of an integrated circuit having both electronic data processing and memory and electromagnetic radiation information receiving, processing or transmitting capability. The present invention is the first to fabricate, and demonstrate the semiconducting nature of, a thin film of rhenium disilicide which is effective in the infrared region.

PROBLEM

It is a problem to fabricate infrared detectors that are efficient and can be integrated monolithically with other circuitry. Practical devices currently available include intrinsic infrared semiconductor detectors as discrete devices or linked to electronic circuitry in some form other than on a single silicon chip. Schottky barrier infrared detectors are also available and workable but are slow for communication purposes and have relatively low quantum efficiency. The Schottky barrier devices are of limited wavelength range, but they have been integrated successfully in focal plane arrays on a silicon chip.

Silicon intrinsic detectors are effective for visible light and perhaps can be extended in time to wavelengths up to about 0.9 microns. Extrinsic silicon detectors are sensitive to much longer wavelengths, but have absorption coefficients of 1000 to 10,000 times lower than those of intrinsic detectors.

Germanium and germanium-silicon alloys can be grown on a silicon wafer. The absolute long-wavelength limit for germanium based alloys is one micron and value of about 1.9 microns with virtually pure germanium. However, germanium and germanium-silicon alloys are relatively weak absorbers of infrared radiation. Special structures, such as wave guides, must be developed to use both germanium and germanium-silicon alloys as thin films. The wave guides and other structures are necessary because such devices are weak absorbers of infrared radiation.

There is also available a family of Mercury-Cadmium-Tellerium devices for infrared detection. These devices operate without being able to be combined, to date, with an effective microelectronics technology as is possible with silicon based devices.

The devices described above have been effective to some extent. However, there still remains a need for detectors meeting all of the following characteristics: (1) The efficiency of an intrinsic semiconductor detector; (2) Efficient operation in the 1.0 to 14 micron wavelength range; and, (3) Practical fabrication on a silicon chip in a monolithic structure. The need for such devices has been recognized by persons skilled in this art and some attempts have been made recently to fabricate such a device using gallium arsenide (GaAs) and related compounds on a silicon substrate. However, these materials are not currently compatible with silicon processing.

SOLUTION

These problems are solved and a technical advance achieved in the field by rhenium disilicide infrared detector devices which are capable of (1) exhibiting decreased electrical resistance or (2) generating a photocurrent or photovoltage when exposed to electromagnetic radiation.

There are numerous applications for infrared detectors, one of which is for terrestrial imaging from space. The limited wavelengths which can be transmitted through the atmosphere are approximately 1.5 to 1.9; 2.0 to 2.6; 3.4 to 4.2; 4.5 to 5.0 and 8 to 13 microns NASA has shown an interest in the 2.5 to 30 micron wavelength range. Another application for the present invention is in combination with fiber optic systems using silica based fibers (which in long haul, high capacity systems have narrow spectral windows centered on about 1.3 and 1.55 microns). A short haul system has an additional spectral window from about 0.8 to 0.9 microns as well as the windows at about 1.3 and 1.55 microns. In such applications, the output of the infrared sources can be fed directly to the fiber optics for transmission to an infrared detector and an associated processor. Since the present rhenium disilicide devices are silicon-compatible, they can be combined on the same chip as other silicon based elements such as data storage and data processing elements In such a combination, the signal processing and related computing can be performed on the very same chip that holds the source, detector, imaging or detector array. Monolithic systems afford many advantages compared to hybrid systems.

The detectors can be arranged singly or in an array. A two dimensional array can be constructed. Each element in the array has an output which can be converted into a digital electrical signal.

DESCRIPTION OF THE INVENTION

Figure 1:
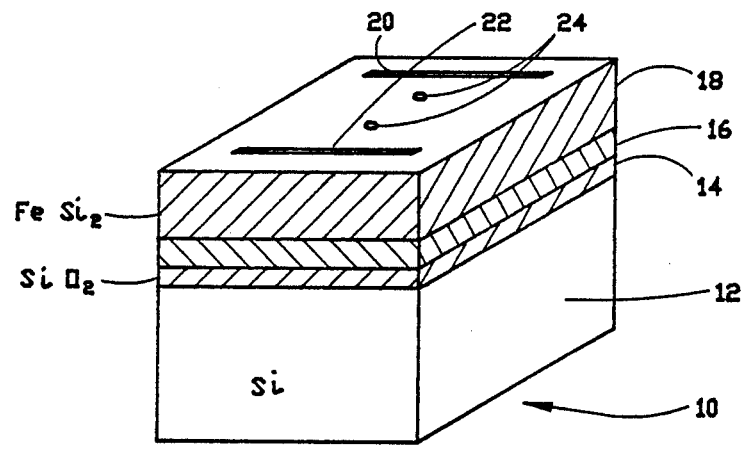
FIG. 1 shows a perspective view of one embodiment of the present invention showing a semiconducting metal silicide infrared radiation detector.

FIG. 1 shows a perspective view of one embodiment of the present invention being formed of a semiconducting metal silicide shown generally by the numeral 10. The substrate 12 is a silicon wafer thermally oxidized to grow 1000 angstroms more or less of insulating oxide 14. The oxide layer 14 is then coated with several thousand angstroms of polycrystalline silicon film 16. This polycrystalline silicon film 16 is added commonly by low pressure vapor deposition. A thin film of metal, rhenium, is then added to the polycrystalline silicon film 16 and then reacted by heating the sample in an inert environment to react the metal film with the polycrystalline silicon film 16 to form a semiconducting metal silicide 18, rhenium disilicide ($ReSi_2$). Electrical contact with the semiconducting metal silicide 18 is achieved by depositing an aluminum or other conductive film 20, 22 and 24 on the semiconducting metal silicide 18 which is then photolithographically patterned.

Other insulating substrates can be used and coated with a silicon film. The metal deposition technique can be evaporation or chemical vapor deposition. Futhermore, the metal silicide film may be formed by (simultaneous) codeposition of metal and silicon.

Figure 6:
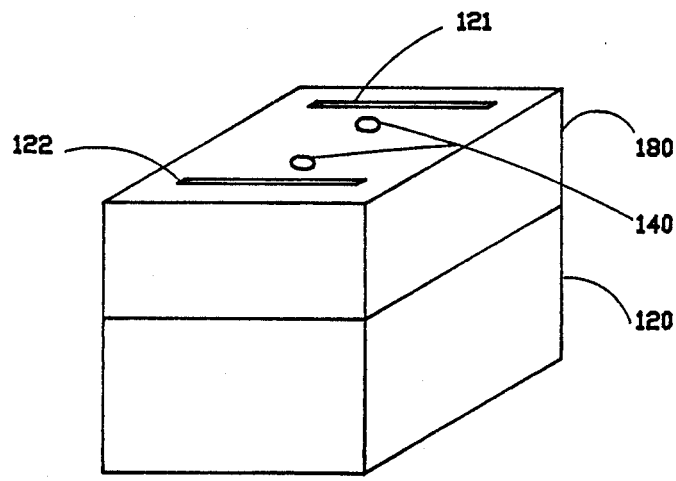
FIG. 6 is a perspective view of another embodiment of the present invention showing the semiconducting metal silicide layer directly on the silicon substrate.

FIG. 6 shows a another embodiment of the semiconductive metal silicide detector having a substrate 120 on top of which is formed a thin film of semiconducting rhenium disilicide 180. Conductive pads 121, 122 and 140 are formed on the surface of the semiconductive metal silicide thin film 180.

The metal can be chosen from the group consisting of: iron, iridium, manganese, chromium, rhenium, magnesium, calcium, barium or osmium. The semiconducting metal silicides formed are: iron disilicide ($FeSi_2$), iridium silicide ($IrSi_{1.75}$), manganese silicide ($MnSi_{1.7}$), chromium disilicide ($CrSi_2$), rhenium disilicide ($ReSi_2$), magnesium silicide ($Mg_2Si$), barium disilicide ($BaSi_2$), calcium silicide ($Ca_2Si$) or osmium disilicide ($OsSi_2$) respectively.

The process for forming each semiconducting metal silicide varies as to annealing temperature and time. The chart 1 shown below shows some combinations of time, temperature and a range of thickness for the semiconducting metal silicides. Each semiconducting metal silicide thus made has been tested and shown to be a true semiconductor which demonstrates useful radiation detection properties based either on analysis of the data showing the optical absorption edge for each material together with measurements of electrical resistivity as a function of temperature.

CHART 1

| Element | Temp./Time (minutes) | Thickness (Angstroms) |
|---|---|---|
| Chromium | 900 C./120–1100 C./120 | 1000–13,000 |
| Manganese | 800 C./120–1000 C./60 | 1900–15,000 |
| Iridium | 750 C./120–850 C./120 | 1355–5,418 |
| Rhenium | 900 C./120 | 307–768 |
| Iron | 900 C./120 | 700–3,200 |

The active silicide layer can be made by depositing a thin film of the desired metal onto a silicon wafer which has been polished and cleaned for integrated circuit fabrication. It is important to have a clean metal-silicon interface before annealing. After heating to the proper temperature and for the proper time, the metal film will react with the silicon substrate to form semiconducting metal silicide. The semiconducting metal silicide film may also be grown on a polycrystalline silicon surface.

For example, rhenium disilicide ($ReSi_2$) was prepared by ion beam sputtering of rhenium film onto 1-0-0 polished silicon wafers. The semiconducting metal silicide layer was grown by reaction of the rhenium metal film with the silicon substrate at an elevated temperature such as 900 degrees C. in an inert environment of flowing argon gas. The substrate is ion-milled in vacuum immediately prior to metal deposition.

Figure 2:
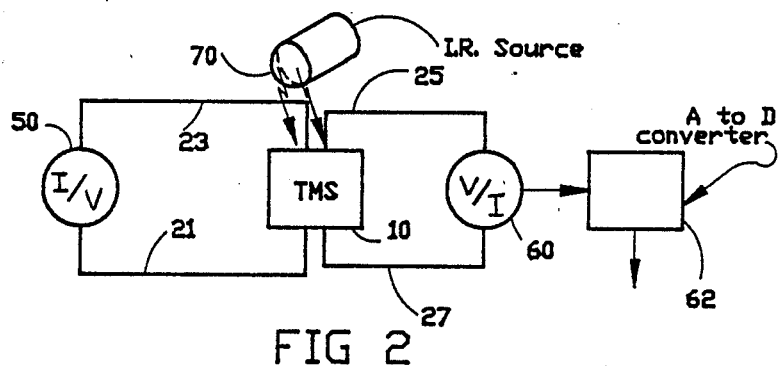
FIG. 2 illustrates a circuit that uses the semiconductive metal silicide infrared radiation detector of FIG. 1.

FIG. 2 illustrates a circuit that uses the semiconductive rhenium disilicide detector of FIG. 1. The conductive pads 20, 22 formed on the semiconducting rhenium silicide layer shown in FIG. 1 are connected by wires 21, 23 to a constant current source 50. Conductive pads 24 of FIG. 1 are connected by wires 25, 27 to a voltmeter 60. A source of infrared radiation 70 illuminates semiconducting metal silicide infrared detector device 10. The resistance of the semiconducting metal silicide infrared detector device 10 drops as it is exposed to infrared radiation so that the voltage measured by voltmeter 60 drops as a function of the intensity of infrared radiation from infrared radiation source 70. An analog-to-digital converter 62 is shown receiving information from voltmeter 60 for digitizing the output of the semiconducting metal silicide infrared detector 10. Alternatively, a change in current in the presence of a constant voltage across the detector device 10 can be measured to determine the change in resistance of device 10.

Figure 3:
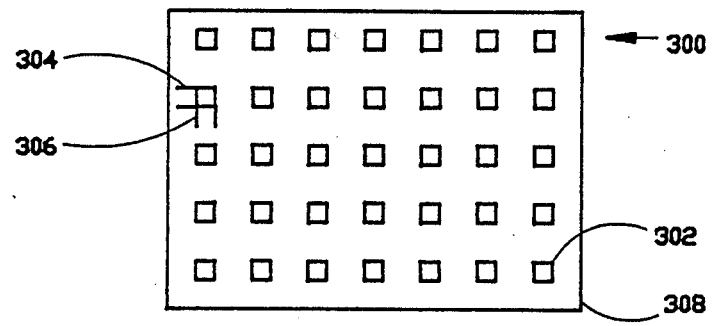
FIG. 3 shows an array of devices shown in FIG. 1 forming another embodiment of the present invention.

FIG. 3 shows an array of infrared detector devices of the type shown in FIG. 1. The array shown generally by the number 300 is formed of semiconducting metal silicide infrared detector devices 302. Each infrared detector device 302 has leads 304 into which a constant current can be fed from a current source (not shown). Each infrared detector device 302 also has leads 306 from which the voltage drop across the infrared detector device can be measured or detected. The array 300 is grown on a substrate 308 which can be formed of a wide variety of materials including silicon. If silicon is the chosen substrate, the entire array can be formed monolithically. In that case, the leads 304, 306 would be formed on the substrate 308 photolithography by techniques well known in the semiconductor fabricating industry.

Figure 4:
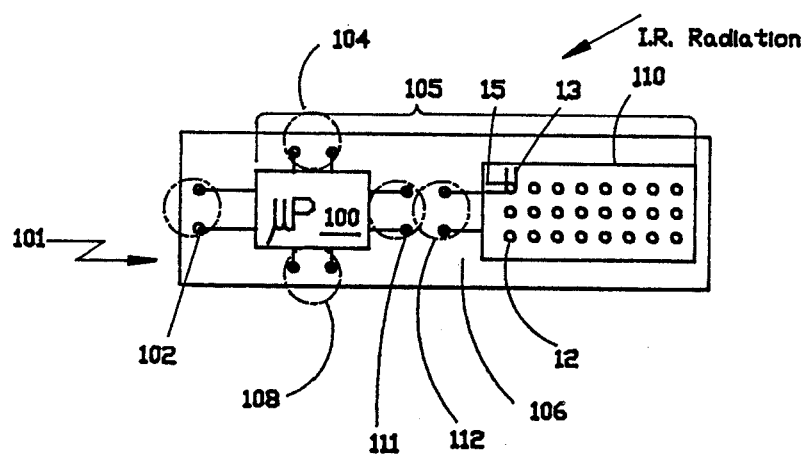
FIG. 4 shows an array of devices, as shown in FIG. 3, formed on a common silicon substrate with a very large scale integrated circuit forming another embodiment of the present invention.

FIG. 4 shows an integrated circuit 101 formed of microprocessor circuitry 100 (or other VLSI device) and a semiconducting metal silicide infrared detector array 110 shown for the purposes of illustration only as a separate element. One use of such a device is incoming missile detection and ranging. Currently, such combinations of infrared detection and computer analysis of the incoming signals are performed by interconnecting discrete devices or by using monolithic arrays of Schottky barrier detectors. The discrete devices each perform satisfactorily but are not as fast, compact, low cost to make, or reliable as a single integrated device. The Schottky barrier detectors have a low quantum efficiency and are relatively slow devices. The potential speed difference is substantial, perhaps 100 times that of present devices. Intrinsic semiconductor detectors have a higher quantum efficiency than Schottky barrier detectors. The quality of the electrical interconnects is an important factor in the speed of the device. Similarly, the integrated system is more rugged, faster and more reliable than a hybrid system formed of discrete devices. The net result is that such devices could be hand held or easily portable. The increased speed of data processing, the ruggedness and reliability can be critical in military and space use.

FIG. 4 shows the array as a two dimensional array of semiconducting metal silicide detectors 12 whose output is represented by the bundle of leads 112 which contain data fed to microprocessor circuitry 100. Microprocessor circuitry 100 fabricated on substrate 106 receives power through leads 102 and transmits information via leads 104. Additional data and control information may be placed into the microprocessor by leads 108. The entire integrated circuit 105 is fabricated on a substrate 106 typically of silicon.

Figure 5:
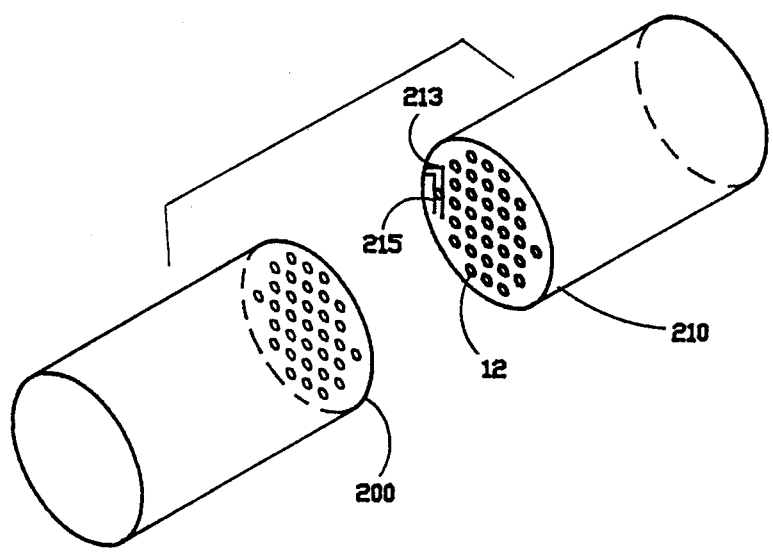
FIG. 5 shows an array of semiconducting metal silicide infrared detectors arranged in an array to mate with a bundle of optical fibers forming still another embodiment of the present invention.

FIG. 5 shows a bundle of optical fibers 200 which are aligned with and receive signals from a mated array 210 of semiconducting metal silicide sources 12. The direction of transmission can be reversed so that the fiber optic bundle 200 transmit radiation to an array of semiconducting metal silicide detectors 12. While the sources can in some cases operate as detectors, in practice devices are optimized for each application as either sources or detectors.

Figure 7:
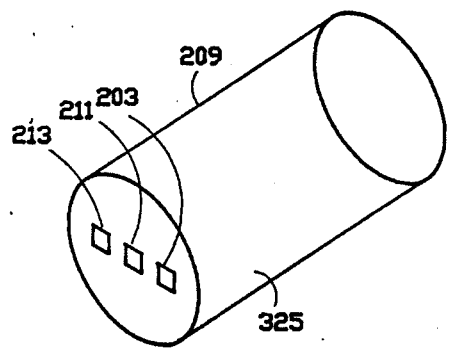
FIG. 7 shows an array of semiconducting metal silicide infrared detectors arranged to mate with an array of optical fibers forming still another embodiment of the present invention.
Figure 7:
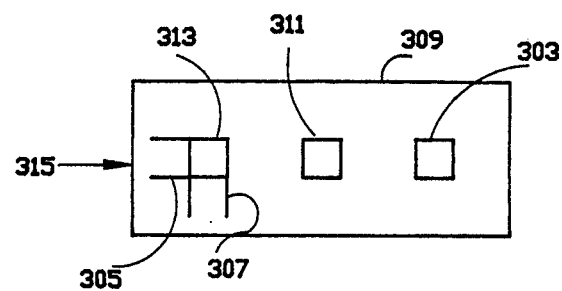

FIG. 7 shows a linear array 309 of semiconducting metal silicide detectors 313, 311 and 303 having leads 305 and 307 for receiving current and for connecting to instruments for measuring changed resistance, photocurrent or photovoltage. The linear array 309 is mated with a matching array of optical fibers 325 having, for example, three fibers 203, 211 and 213 which align with corresponding elements 303, 311 and 313 as shown in the figure.

Figure 8:
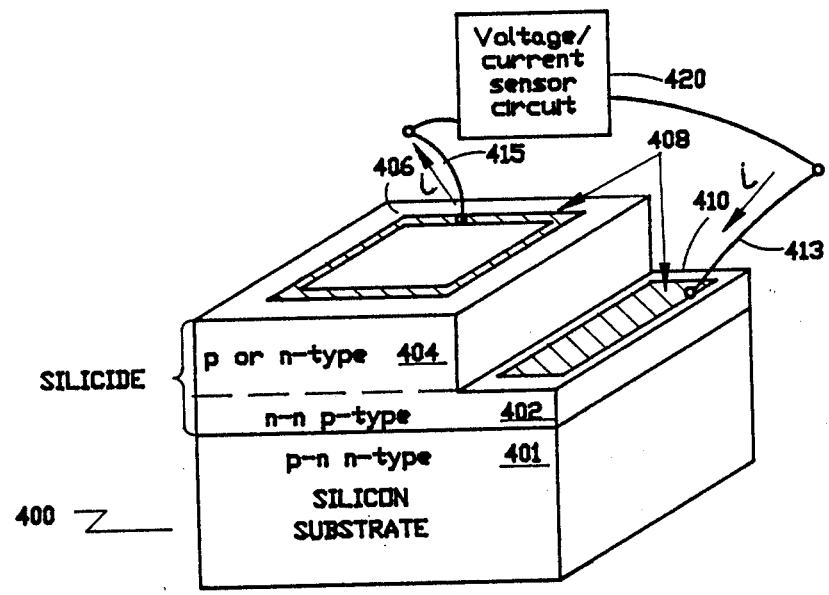
FIG. 8 shows a perspective view of a semiconducting metal homojunction radiation source and detector forming another embodiment of the present invention.

FIG. 8 shows in detail a substrate 401 which can be formed of either p- or n- type silicon and has two layers of either n or p type doped semiconducting metal silicide 402 and 404 formed thereon. The upper and lower semiconducting metal silicide layers must be oppositely doped material and the substrate 401 can be opposite in doping to the semiconducting metal silicide layer adjacent to it as shown in FIG. 8. Part of the upper semiconducting metal silicide layer 406 is removed to expose the surface 410 of the lower semiconducting metal silicide layer 402. Conductive contacts 408 are formed on both surfaces 406 and 410 for permitting electrical connection to the device. Current is injected at lead 413 and removed at lead 415 or vice versa for operation as a source of electromagnetic radiation. When exposed to electromagnetic radiation, the device may generate a photocurrent "i" or alternatively a photovoltage between leads 413 and 415. Voltage/current sensor circuit 420 is connected to leads 413, 415 to detect the photovoltage/photocurrent and changes therein due to the applied infrared radiation.

Figure 9:
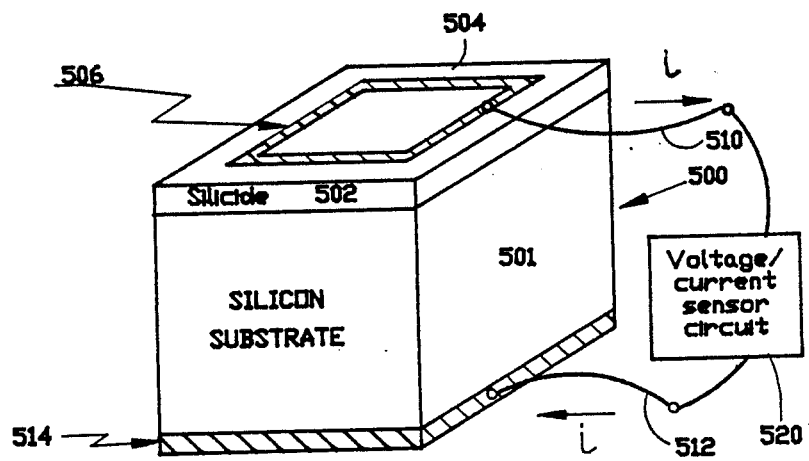
FIG. 9 is a perspective view of a semiconducting metal heterojunction infrared radiation detector forming another embodiment of the present invention.

FIG. 9 shows another embodiment in the form of a heterojunction device 500 having a silicon substrate 501 and a semiconducting metal silicide thin film 502. Conductive contacts 514 and 506 are formed on the bottom of the substrate and the top of the semiconducting metal silicide thin film, respectively. Current is injected at lead 512 and removed at lead 510 or vice versa for operation of heterojunction device 500 as a source of electromagnetic radiation. When exposed to electromagnetic radiation, the heterojunction device 500 may generate a photocurrent "i" or alternatively a photovoltage between leads 510 and 512. Voltage/current sensor circuit 520 is connected to leads 510, 512 to detect the photovoltage/photocurrent and changes therein due to the applied infrared radiation.

Figure 10:
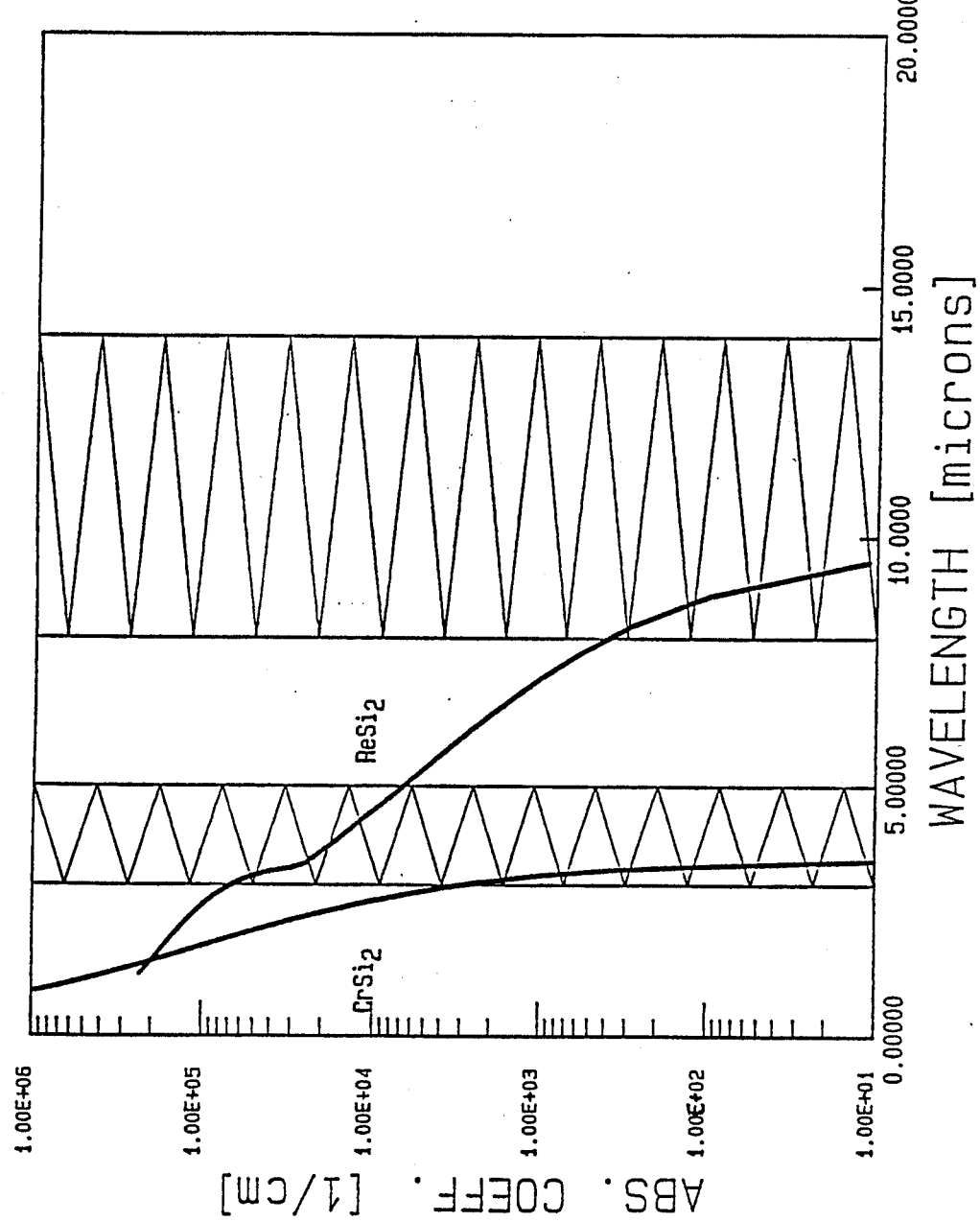
FIG. 10 is a chart showing the optical absorption coefficient of the present semiconducting metal silicide infrared radiation detector.
Figure 11:
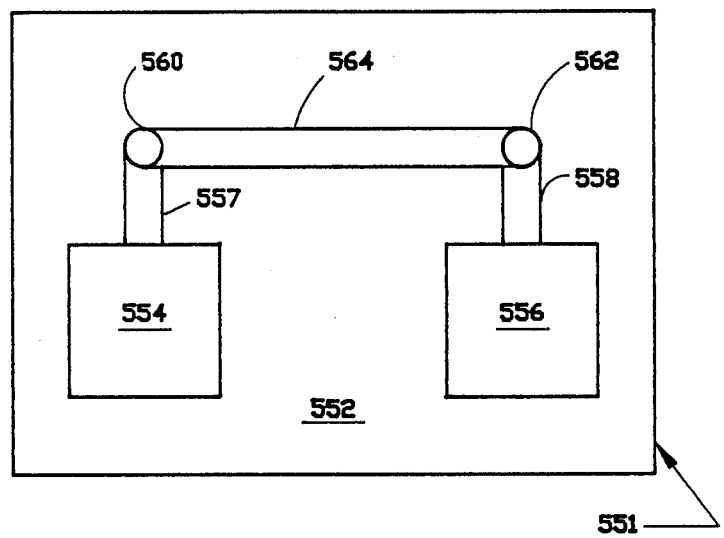
Figure 12:
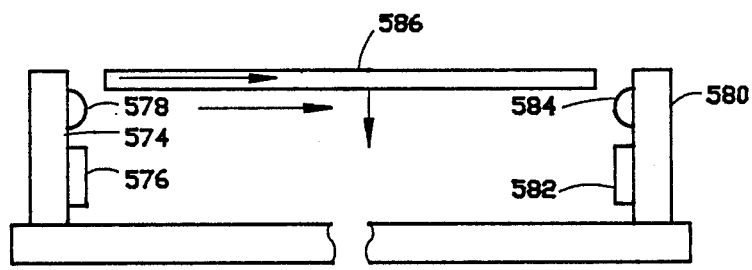

FIG. 10 is a graph showing the experimentally measured optical absorption coefficient for the semiconducting rhenium disilicide as a function of wavelength and confirms the infrared detection capabilities of $ReSi_2$ in these longer wavelengths. Superimposed on the graph are atmospheric transmission windows of infrared radiation 520, 521. Certain optical fibers also transmit infrared radiation in these longer wavelength ranges, and NASA has also expressed an interest in extraterrestrial infrared instrumentation applications in these longer wavelength ranges.

Existing silicon compatible intrinsic semiconductor detectors can detect wavelengths up to a range of about two microns, while this rhenium disilicide detector can detect infrared radiation in all practical long wavelengths up to about 14 microns. Thus, this invention provides a silicon compatible intrinsic semiconductor detector that can detect infrared radiation transmitted through the longer wavelength atmospheric transmission windows of infrared radiation, and can be used with fiber optics that transmit such longer wavelength radiation.

While a specific embodiment has been disclosed, it is expected that those skilled in the art will devise alternate embodiments that fall within the scope of the appended claims.

I claim:

1. A method of detecting infrared radiation equal to or less than 14 microns in wavelength comprising the steps of:
    electrically connecting a conductivity detector to a body of semiconducting $ReSi_2$;
    exposing said body of semiconducting $ReSi_2$ to said infrared radiation;
    detecting a change in the conductivity of said body of semiconducting $ReSi_2$ in response to said infrared radiation.

2. The method of claim 1 wherein said step of electrically connecting includes the steps of:
    forming at least two electrically conductive contacts on said body of semiconducting $ReSi_2$ to make ohmic contact with said body of semiconducting $ReSi_2$;
    measuring the conductivity of said body of semiconducting $ReSi_2$ between a first and a second ones of said electrically conductive contacts.

3. The method of claim 2 wherein said step of measuring includes the step of:
    determining the voltage between said first and second electrically conductive contacts in the presence of a constant current therebetween.

4. The method of claim 3 wherein said step of detecting includes the step of:
    measuring the change in said voltage between said first and second electrically conductive contacts, due to said infrared radiation, in the presence of said constant current therebetween.

5. The method of claim 2 wherein said step of measuring includes the step of:
   determining the current between said first and second electrically conductive contacts in the presence of a constant voltage therebetween.

6. The method of claim 5 wherein said step of detecting includes the step of:
   measuring the change in said current between said first and second electrically conductive contacts, due to said infrared radiation, in the presence of said constant voltage therebetween.

7. Infrared detector apparatus for detecting infrared radiation equal to or less than 14 microns wavelength comprising:
   a layer of semiconducting $ReSi_2$ deposited or grown on a substrate, and having first and second electrically conductive contacts formed on said layer of semiconducting $ReSi_2$ for making ohmic contact with said layer of $ReSi_2$;
   means for directing infrared radiation on said layer of semiconducting $ReSi_2$;
   means connected to said first and second electrically conductive contacts for measuring the resistance of said layer of semiconducting $ReSi_2$ between said first and second electrically conductive means.

8. The apparatus of claim 7 further including:
   means connected to said measuring means for registering a change in the, measured resistance of said layer of semiconducting $ReSi_2$ between said first and second electrically conductive contacts in response to said infrared radiation.

9. The apparatus of claim 7 where said measuring means includes:
   means for measuring the voltage between said first and said second electrically conductive contacts in the presence of a constant current therebetween.

10. The apparatus of claim 7 where said measuring means includes:
    means for measuring the current between said first and second electrically conductive contacts in the presence of a constant voltage therebetween.

11. Infrared detector apparatus for detecting infrared radiation comprising:
    substrate means;
    a layer of semiconducting $ReSi_2$ deposited or grown on said substrate means;
    first and second electrically conductive means formed on said layer of semiconducting $ReSi_2$ for making ohmic contact with said layer of $ReSi_2$;
    means for directing infrared radiation equal to or less than 14 microns wavelength on said layer of semiconducting $ReSi_2$;
    means connected to said first and second electrically conductive means for measuring the resistance of said layer of semiconducting $ReSi_2$ between said first and second electrically conductive means.

12. The apparatus of claim 11 further including:
    means connected to said measuring means for registering a change in the measured resistance of said layer of semiconducting $ReSi_2$ between said first and second electrically conductive means in response to said infrared radiation.

13. The apparatus of claim where said measuring means includes:
    means for measuring the voltage between said first and said second electrically conductive means in the presence of a constant current therebetween.

14. The apparatus of claim 11 where said measuring means includes:
    means for measuring the current between said first and said second electrically conductive means in the presence of a constant voltage therebetween.

15. A method of detecting infrared radiation equal to or less than 14 microns wavelength comprising the steps of:
    depositing or growing a layer of semiconducting $ReSi_2$ on a substrate;
    forming first and second electrically conductive contacts on said layer of semiconducting $ReSi_2$ for making ohmic contact with said layer of $ReSi_2$;
    directing infrared radiation on said layer of semiconducting $ReSi_2$;
    measuring the resistance of said layer of semiconducting $ReSi_2$ between said first and second electrically conductive means.

16. The method of claim 15 further including the step of:
    registering a change in the measured resistance of said layer of semiconducting $ReSi_2$ between said first and second electrically conductive contacts in response to said infrared radiation.

17. The method of claim 16 wherein the step of registering includes the step of:
    measuring a change in the voltage between said first and second electrically conductive contacts in response to said infrared radiation and in the presence of a constant current.

18. The method of claim 16 wherein the step of registering includes the step of:
    measuring a change in the current between said first and second electrically conductive contacts in response to said infrared radiation and in the presence of a constant voltage.

19. An infrared detector for detecting infrared radiation equal to or less than 14 microns wavelength comprising:
    a p- or n- substrate means;
    a first thin film of semiconducting $ReSi_2$ deposited on said substrate means;
    a second thin film of semiconducting $ReSi_2$ deposited on said first thin film and doped with a type of dopant the opposite than of said first thin film;
    first and second electrically conducting means formed on said first and second thin films, respectively;
    means for directing infrared radiation on said layers of semiconducting $ReSi_2$;
    means connected to said first and second electrically conductive means for measuring the photovoltage of said layers of semiconducting $ReSi_2$ between said first and second electrically conductive means.

20. The apparatus of claim 19 wherein said measuring means includes:
    means for registering a change in said photovoltage between said first and second electrically conductive means in response to said infrared radiation.

21. An infrared detector for detecting infrared radiation equal to or less than 14 microns wavelength comprising:
    a p- or n- substrate means;
    a first thin film of semiconducting $ReSi_2$ deposited on said substrate means;

a second thin film of semiconducting ReSi$_2$ deposited on said first thin film and doped with a type of dopant the opposite than of said first thin film;

first and second electrically conducting means formed on said first and second thin films, respectively;

means for directing infrared radiation on said layers of semiconducting ReSi$_2$;

means connected to said first and second electrically conductive means for measuring the photocurrent of said layers of semiconducting ReSi$_2$ between said first and second electrically conductive means.

22. The apparatus of claim 21 wherein said measuring means includes:

means for registering a change in said photocurrent between said first and second electrically conductive means in response to said infrared radiation.

23. An infrared radiation detector for detecting infrared radiation equal to or less than 14 microns in wavelength comprising:

a silicon substrate means;

a thin film of semiconducting ReSi$_2$ formed on said silicon substrate means and doped with a dopant the same as that of said silicon substrate means;

first and second electrically conductive means formed on said thin film of semiconducting ReSi$_2$ and said silicon substrate means, respectively;

means for directing infrared radiation on said thin film of semiconducting ReSi$_2$;

means connected to said first and second electrically conductive means for measuring the photovoltage of said thin film of semiconducting ReSi$_2$ between said first and second electrically conductive means.

24. The apparatus of claim 20 wherein said measuring means includes:

means for registering a change in said photovoltage between said first and second electrically conductive means in response to said infrared radiation.

25. An infrared radiation detector for detecting infrared radiation equal to or less than 14 microns in wavelength comprising:

a silicon substrate means;

a thin film of semiconducting ReSi$_2$ formed on said silicon substrate means and doped with a dopant the same as that of said silicon substrate means;

first and second electrically conductive means formed on said thin film of semiconducting ReSi$_2$ and said silicon substrate means, respectively;

means for directing infrared radiation on said thin film of semiconducting ReSi$_2$;

means connected to said first and second electrically conductive means for measuring the photocurrent of said thin film of semiconducting ReSi$_2$ between said first and second electrically conductive means.

26. The apparatus of claim 25 wherein said measuring means includes:

means for registering a change in said photocurrent between said first and second electrically conductive means in response to said infrared radiation.

27. An infrared radiation detector for detecting infrared radiation equal to or less than 14 microns in wavelength comprising:

a silicon substrate means;

a thin film of semiconducting ReSi$_2$ formed on said silicon substrate means and doped with a dopant opposite to that of said silicon substrate means;

first and second electrically conductive means formed on said thin film of semiconducting ReSi$_2$ and said silicon substrate means, respectively;

means for directing infrared radiation on said thin film of semiconducting ReSi$_2$;

means connected to said first and second electrically conductive means for measuring the photovoltage of said thin film of semiconducting ReSi$_2$ between said first and second electrically conductive means.

28. The apparatus of claim 27 wherein said measuring means includes:

means for registering a change in said photovoltage between said first and second electrically conductive means in response to said infrared radiation.

29. An infrared radiation detector for detecting infrared radiation equal to or less than 14 microns in wavelength comprising:

a silicon substrate means;

a thin film of semiconducting ReSi$_2$ formed on said silicon substrate means and doped with a dopant opposite to that of said silicon substrate means;

first and second electrically conductive means formed on said thin film of semiconducting ReSi$_2$ and said silicon substrate means, respectively;

means for directing infrared radiation on said thin film of semiconducting ReSi$_2$;

means connected to said first and second electrically conductive means for measuring the photocurrent of said thin film of semiconducting ReSi$_2$ between said first and second electrically conductive means.

30. The apparatus of claim 29 wherein said measuring means includes:

means for registering a change in said photocurrent between said first and second electrically conductive means in response to said infrared radiation.

* * * * *